(12) United States Patent
Do et al.

(10) Patent No.: US 7,659,145 B2
(45) Date of Patent: Feb. 9, 2010

(54) SEMICONDUCTOR DEVICE AND METHOD OF FORMING STEPPED-DOWN RDL AND RECESSED THV IN PERIPHERAL REGION OF THE DEVICE

(75) Inventors: Byung Tai Do, Singapore (SG); Heap Hoe Kuan, Singapore (SG); Reza A. Pagaila, Singapore (SG); Linda Pei Ee Chua, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 12/172,817

(22) Filed: Jul. 14, 2008

(65) Prior Publication Data

US 2010/0007029 A1    Jan. 14, 2010

(51) Int. Cl.
 *H01L 21/00* (2006.01)

(52) U.S. Cl. ...................... 438/109; 438/667

(58) Field of Classification Search .............. 257/774; 438/109, 667
See application file for complete search history.

(56) References Cited

U.S. PATENT DOCUMENTS

| | | | |
|---|---|---|---|
| 6,391,685 B1 * | 5/2002 | Hikita et al. | 438/113 |
| 6,420,244 B2 | 7/2002 | Lee | |
| 6,852,607 B2 | 2/2005 | Song et al. | |
| 7,215,033 B2 | 5/2007 | Lee et al. | |
| 7,276,799 B2 | 10/2007 | Lee et al. | |
| 7,528,477 B2 * | 5/2009 | Jeung et al. | 257/690 |

* cited by examiner

*Primary Examiner*—Roy K Potter
(74) *Attorney, Agent, or Firm*—Robert D. Atkins

(57) ABSTRACT

A semiconductor die has a peripheral region around the die. An insulating layer is formed over the semiconductor die. A portion of the insulating layer and peripheral is removed to form a recess around the semiconductor die. A conductive layer is deposited over the insulating layer and recess. The conductive layer is electrically connected to contact pads on the semiconductor die and conforms to a step into the recess. A gap is created through the conductive layer and peripheral region around the semiconductor die. An insulating material is deposited in the gap. A portion of the insulating material is removed to form a through hole via (THV). A conductive material is deposited in the THV to form a conductive THV. The conductive THV is recessed with respect to a surface of the semiconductor die. The conductive THV is electrically connected to the conductive layer.

20 Claims, 14 Drawing Sheets

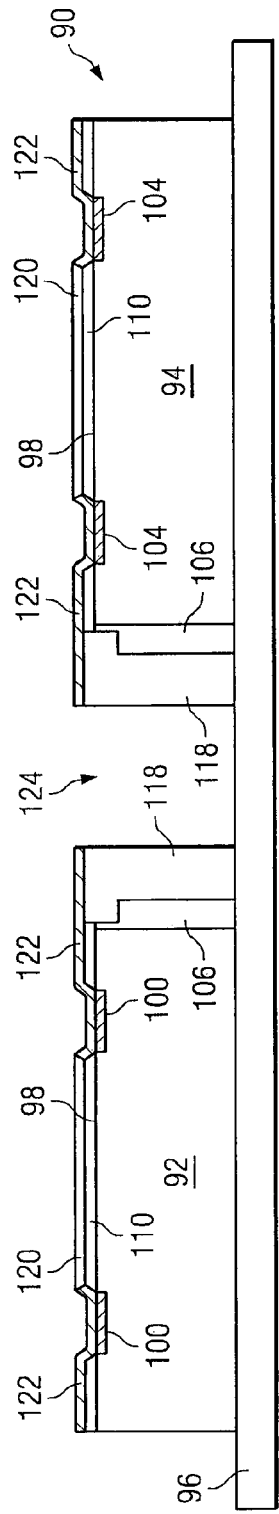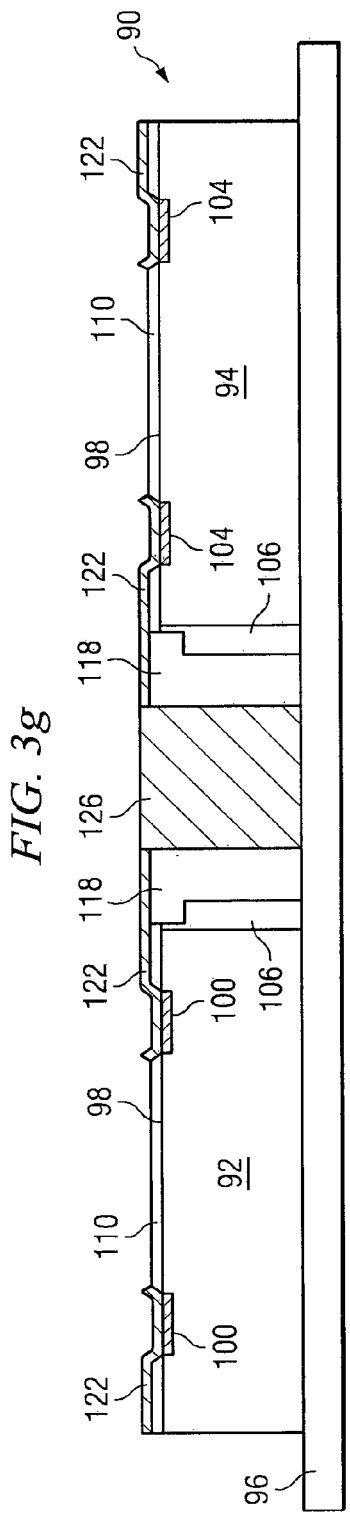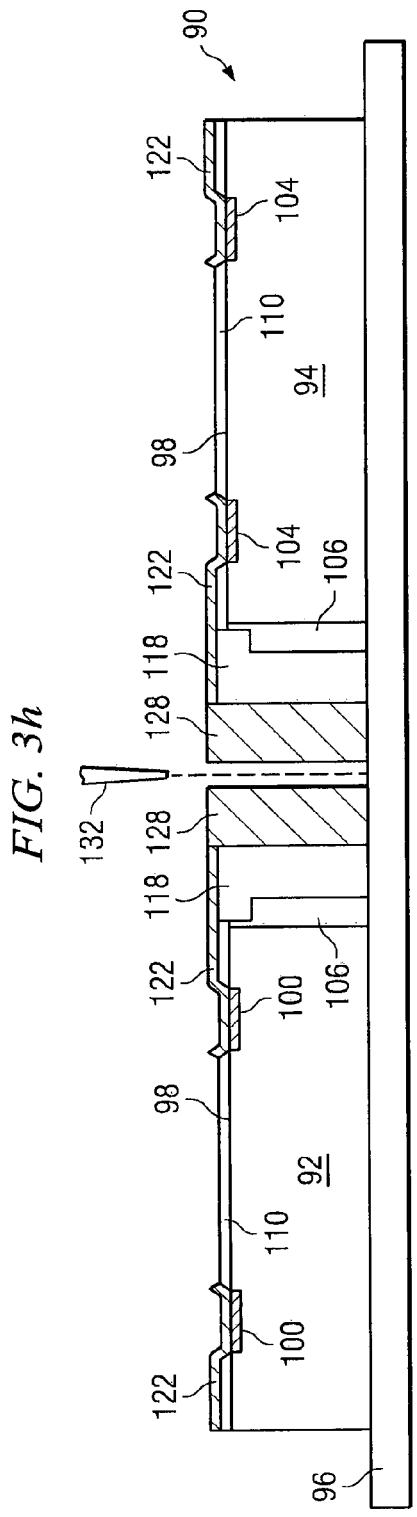

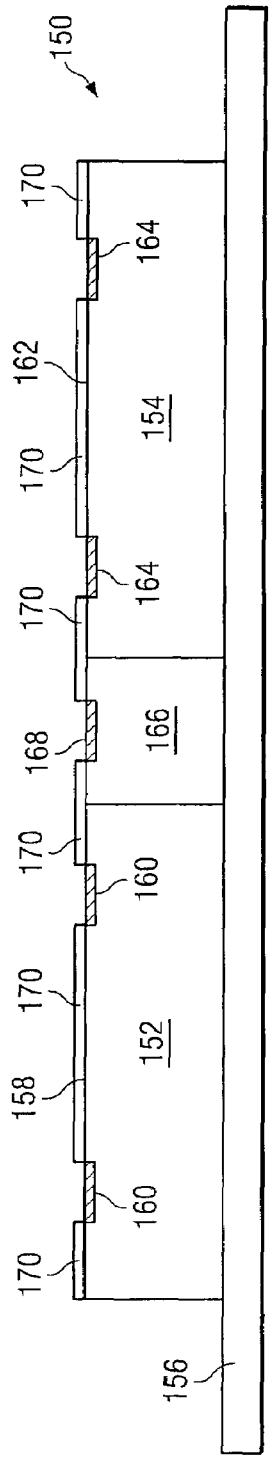
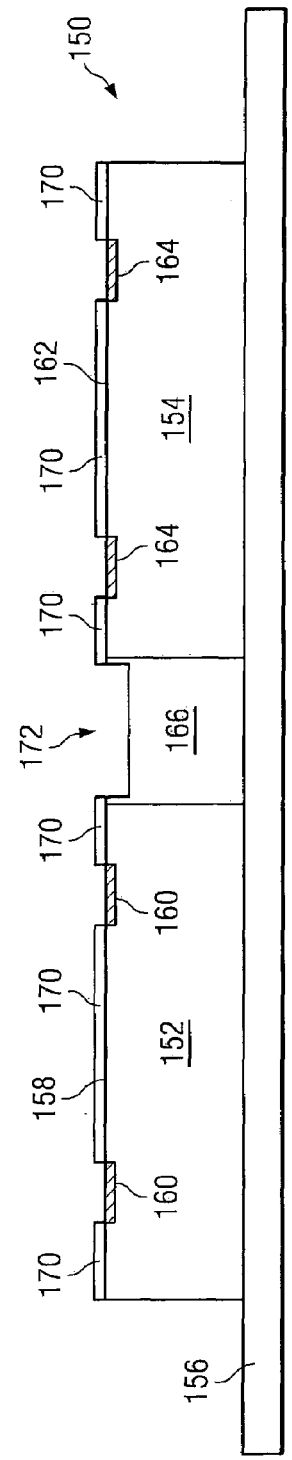
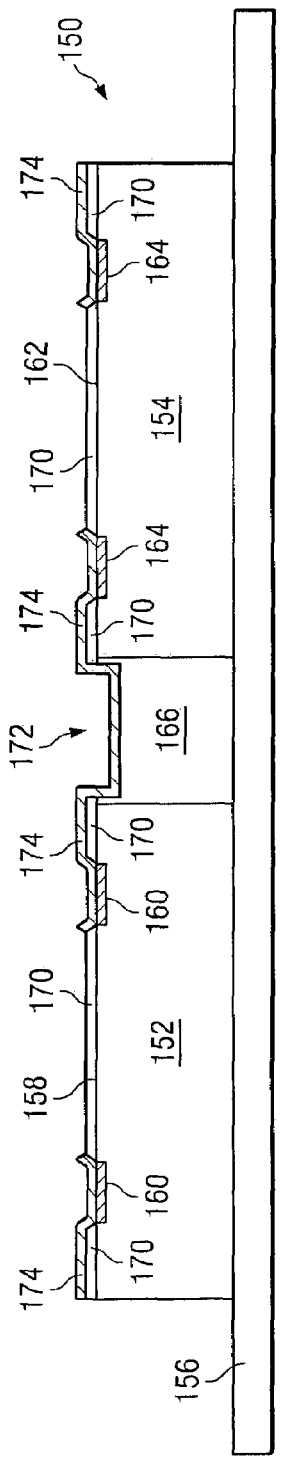

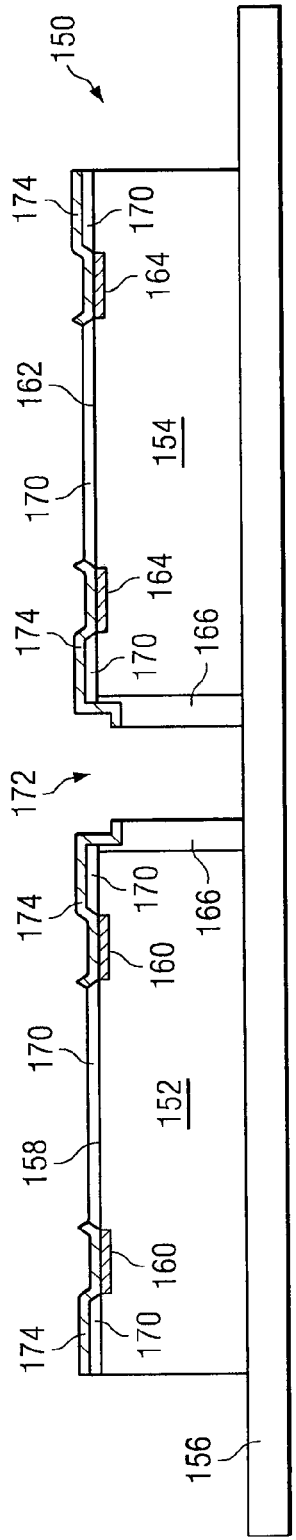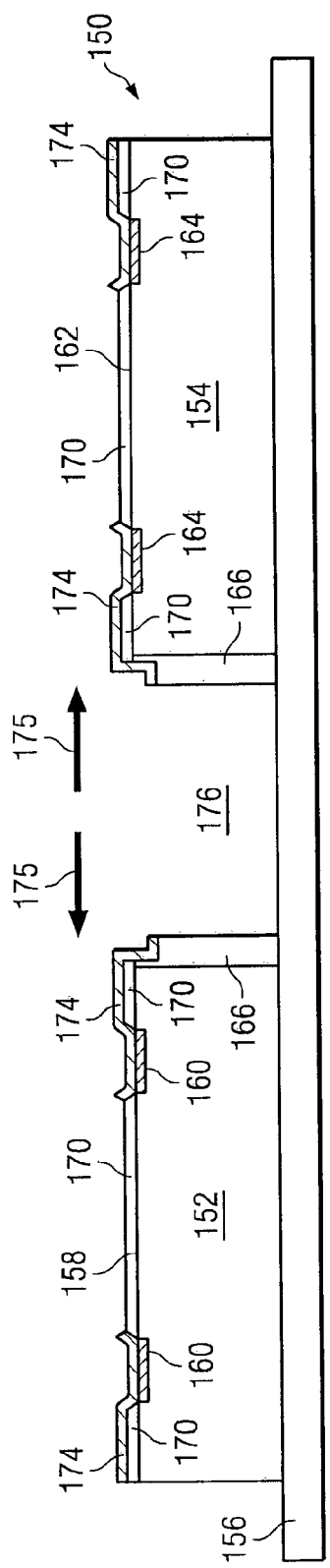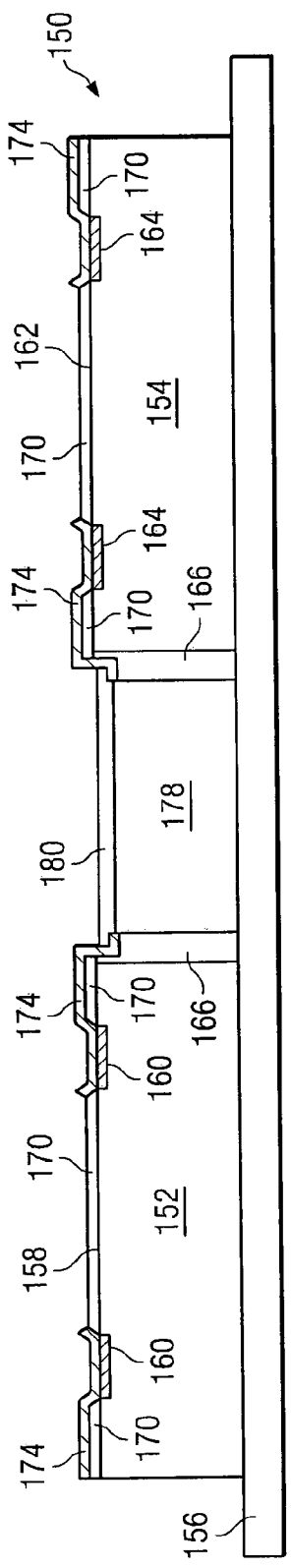
FIG. 6d
FIG. 6e
FIG. 6f

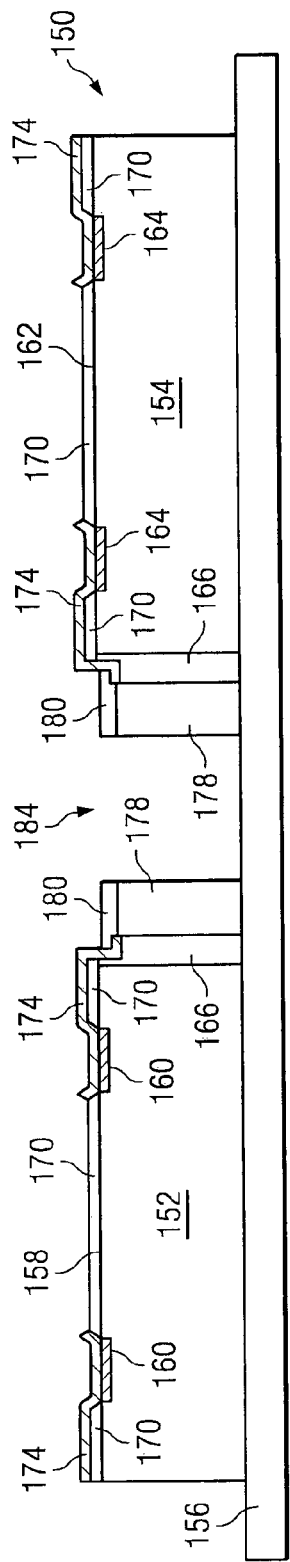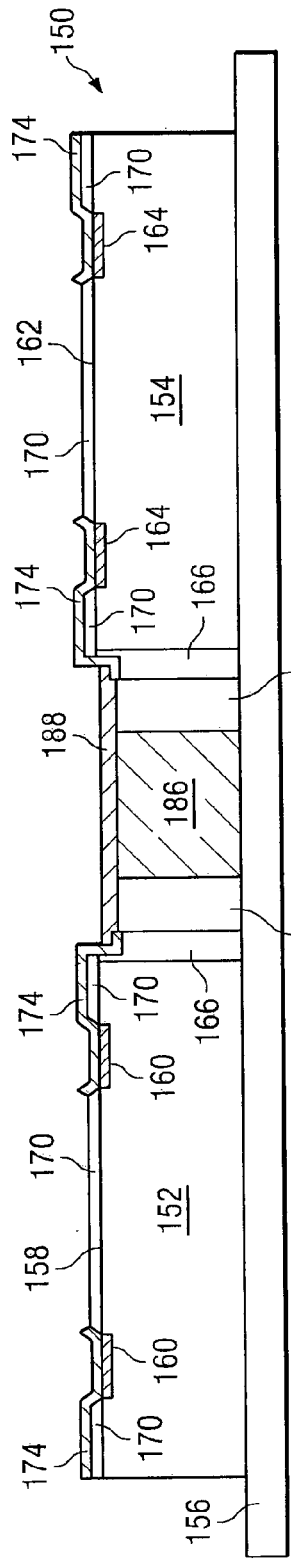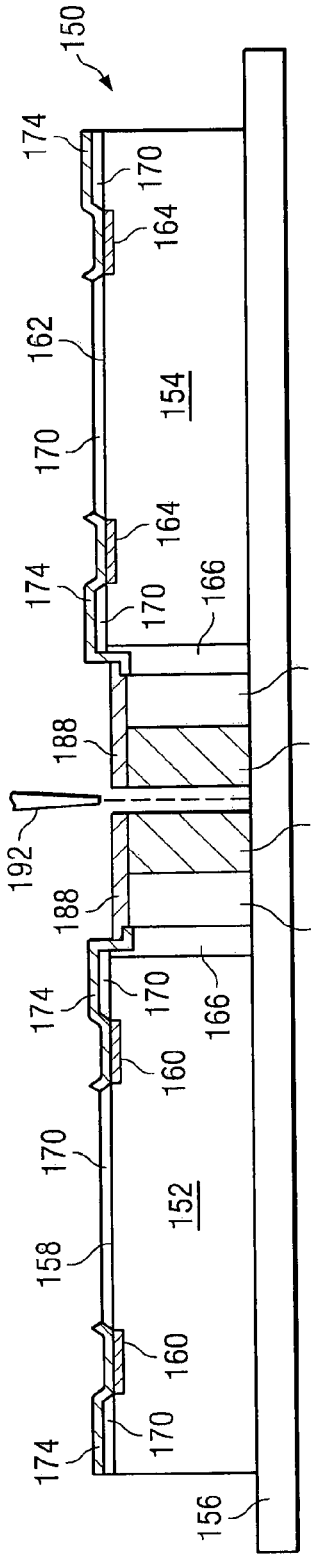

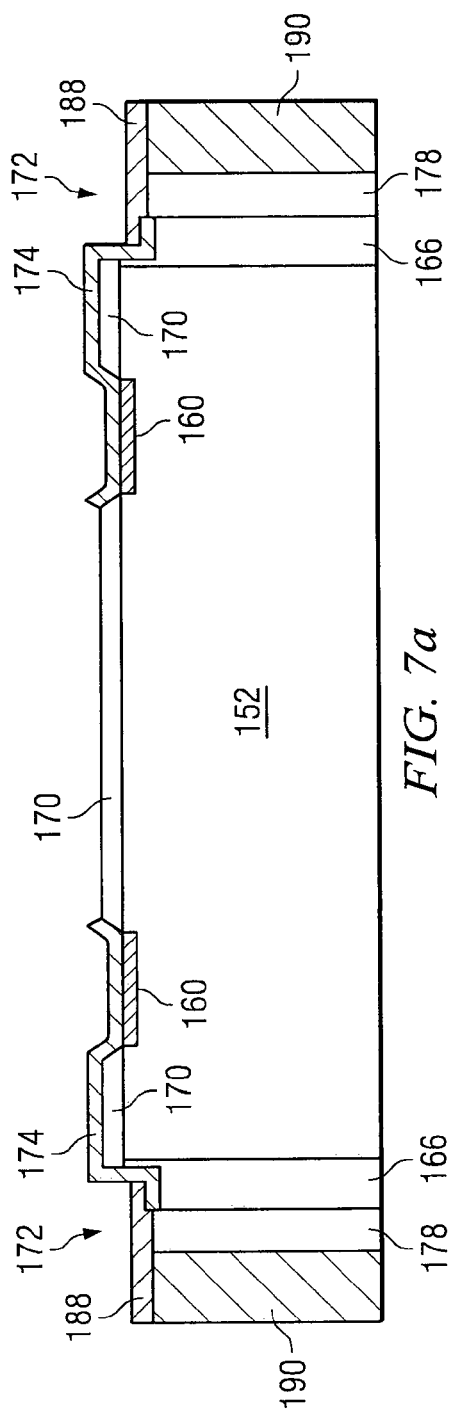
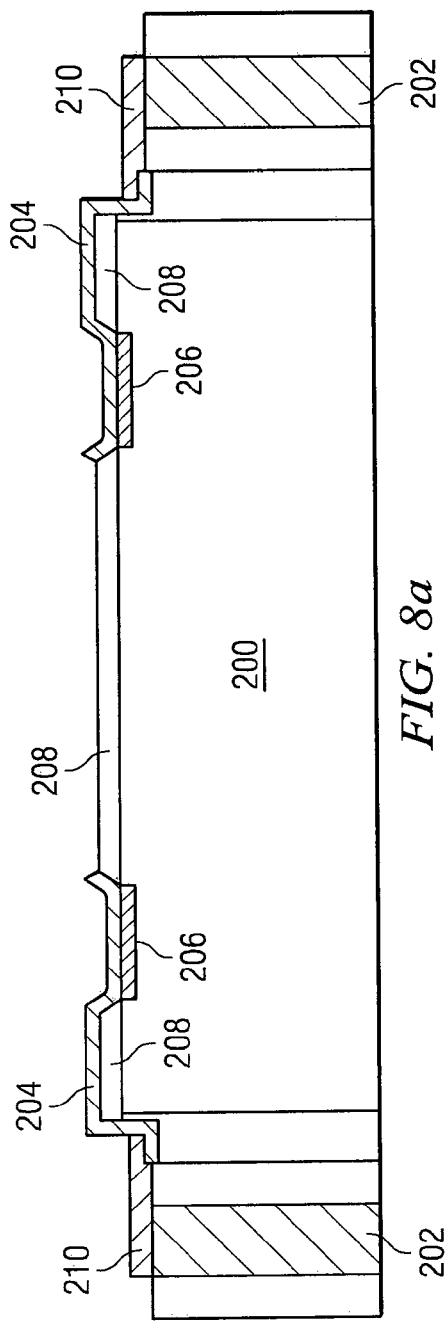
FIG. 7a
FIG. 8a

SEMICONDUCTOR DEVICE AND METHOD OF FORMING STEPPED-DOWN RDL AND RECESSED THV IN PERIPHERAL REGION OF THE DEVICE

FIELD OF THE INVENTION

The present invention relates in general to semiconductor devices and, more particularly, to a semiconductor device having stepped-down RDL and recessed THV formed in a peripheral region around the device.

BACKGROUND OF THE INVENTION

Semiconductor devices are found in many products in the fields of entertainment, communications, networks, computers, and household markets. Semiconductor devices are also found in military, aviation, automotive, industrial controllers, and office equipment. The semiconductor devices perform a variety of electrical functions necessary for each of these applications.

The manufacture of semiconductor devices involves formation of a wafer having a plurality of die. Each semiconductor die contains hundreds or thousands of transistors and other active and passive-devices performing a variety of electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and environmental isolation.

One goal of semiconductor manufacturing is to produce a package suitable for faster, reliable, smaller, and higher-density integrated circuits (IC) at lower cost. Flip chip packages or wafer level chip scale packages (WLCSP) are ideally suited for ICs demanding high speed, high density, and greater pin count. Flip chip style packaging involves mounting the active side of the die face down toward a chip carrier substrate or printed circuit board (PCB). The electrical and mechanical interconnect between the active devices on the die and conduction tracks on the carrier substrate is achieved through a solder bump structure comprising a large number of conductive solder bumps or balls. The solder bumps are formed by a reflow process applied to solder material deposited on contact pads, which are disposed on the semiconductor substrate. The solder bumps are then soldered to the carrier substrate. The flip chip semiconductor package provides a short electrical conduction path from the active devices on the die to the carrier substrate in order to reduce signal propagation, lower capacitance, and achieve overall better circuit performance.

In many applications, it is desirable to vertically stack semiconductor die for greater device integration and minimize interconnect routing. The electrical interconnection between stacked semiconductor die has been done by using through hole vias (THV) which traverse from a front side to the backside of the die. The THVs are formed by drilling through the active area of the die or through saw streets on the wafer prior to any dicing operation. The THVs are filled with conductive material. The wafer is singulated by sawing through the saw streets to separate the semiconductor die.

Patterns of test contact pads are commonly formed in the saw streets for die testing purposes. However, sawing through the test contact pads in the saw streets can cause die chipping as the test contact pads are typically brittle in nature. In addition, if the THVs are formed in the saw streets, the wafer must be expanded to increase the gap between the die and provide adequate spacing to form the THVs. The sawing process prior to wafer expansion often results in irregular cutting and further die chipping.

The THVs are electrically connected to contacts pads on the semiconductor die with metal traces or redistribution layers (RDL). In the wafer expansion process, the x and y directional movement of the wafer may not be even, causing the die to become misaligned. Any post-expansion misalignment of the die makes RDL patterning between the contact pads and THV more difficult.

SUMMARY OF THE INVENTION

A need exists to compensate for post-expansion misalignment of die and reduce possibility of die chipping. Accordingly, in one embodiment, the present invention is a method of making a semiconductor device comprising the steps of providing a semiconductor wafer having a plurality of semiconductor die each with a peripheral region around the semiconductor die, forming an insulating layer over the semiconductor wafer, removing a portion of the insulating layer and peripheral region to form a recess around the semiconductor die, and depositing a first conductive layer over the insulating layer and recess. The first conductive layer is electrically connected to contact pads on the semiconductor die and conform to a step into the recess. The method further includes the steps of creating a gap through the first conductive layer and peripheral region around the semiconductor die, depositing an insulating material in the gap, removing a portion of the insulating material to form a through hole via (THV), and depositing a conductive material in the THV to form a conductive THV. The conductive THV is recessed with respect to a surface of the semiconductor die. The conductive THV is electrically connected to the first conductive layer. The method further includes the step of singulating the semiconductor wafer through the gap to separate the semiconductor die.

In another embodiment, the present invention is a method of making a semiconductor device comprising the steps of providing a semiconductor wafer having a plurality of semiconductor die each with a peripheral region around the semiconductor die, forming an insulating layer over the semiconductor wafer, removing a portion of the insulating layer and peripheral region to form a recess around the semiconductor die, creating a gap through the peripheral region around the semiconductor die, depositing an insulating material in the gap, and depositing a conductive layer over the insulating layer and insulating material. The conductive layer is electrically connected to contact pads on the semiconductor die. The method further includes the steps of removing a portion of the insulating material to form a THV, and depositing a conductive material in the THV to form a conductive THV. The conductive THV is electrically connected to the conductive layer. The method further includes the step of singulating the semiconductor wafer through the gap to separate the semiconductor die.

In another embodiment, the present invention is a method of making a semiconductor device comprising the steps of providing a semiconductor die having a peripheral region around the semiconductor die, forming an insulating layer over the semiconductor die, removing a portion of the insulating layer and peripheral region to form a recess around the semiconductor die, and depositing a first conductive layer over the insulating layer and recess. The first conductive layer is electrically connected to contact pads on the semiconductor die and conforms to a step into the recess. The method further includes the steps of creating a gap through the first conductive layer and peripheral region around the semiconductor die, depositing an insulating material in the gap, removing a portion of the insulating material to form a THV, and depositing a conductive material in the THV to form a conductive THV. The conductive THV is recessed with respect to a surface of the semiconductor die. The conductive THV is electrically connected to the first conductive layer.

In another embodiment, the present invention is a semiconductor device comprising a semiconductor die having a peripheral region. An insulating layer is formed over the semiconductor die. A first conductive layer is formed over the insulating layer and into a recess formed in the peripheral region. The first conductive layer is electrically connected to contact pads on the semiconductor die and conforms to a step into the recess. An insulating material is deposited in a gap formed in the peripheral region of the semiconductor die. A conductive THV is formed in the insulating material. The conductive THV is recessed with respect to a surface of the semiconductor die. The conductive THV is electrically connected to the first conductive layer.

BRIEF DESCRIPTION OF THE DRAWINGS

FIGS. 3a-3i illustrate a process of forming RDLs and conductive vias in a peripheral region around the die;

FIGS. 6a-6i illustrate a process of forming stepped RDLs and recessed conductive vias in a peripheral region around the die;

FIGS. 7a-7b illustrate cross-sectional and top views of the semiconductor die with stepped RDLs and recessed conductive half-vias formed around the die; and FIGS. 8a-8b illustrate cross-sectional and top views of the semiconductor die with stepped RDLs and recessed conductive full-vias formed around the die.

DETAILED DESCRIPTION OF THE DRAWINGS

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

The manufacture of semiconductor devices involves formation of a wafer having a plurality of die. Each die contains hundreds or thousands of transistors and other active and passive devices performing one or more electrical functions. For a given wafer, each die from the wafer typically performs the same electrical function. Front-end manufacturing generally refers to formation of the semiconductor devices on the wafer. The finished wafer has an active side containing the transistors and other active and passive components. Back-end manufacturing refers to cutting or singulating the finished wafer into the individual die and then packaging the die for structural support and/or environmental isolation.

A semiconductor wafer generally includes an active surface having semiconductor devices disposed thereon, and a backside surface formed with bulk semiconductor material, e.g., silicon. The active side surface contains a plurality of semiconductor die. The active surface is formed by a variety of semiconductor processes, including layering, patterning, doping, and heat treatment. In the layering process, semiconductor materials are grown or deposited on the substrate by techniques involving thermal oxidation, nitridation, chemical vapor deposition, evaporation, and sputtering. Photolithography involves the masking of areas of the surface and etching away undesired material to form specific structures. The doping process injects concentrations of dopant material by thermal diffusion or ion implantation.

Figure 1:
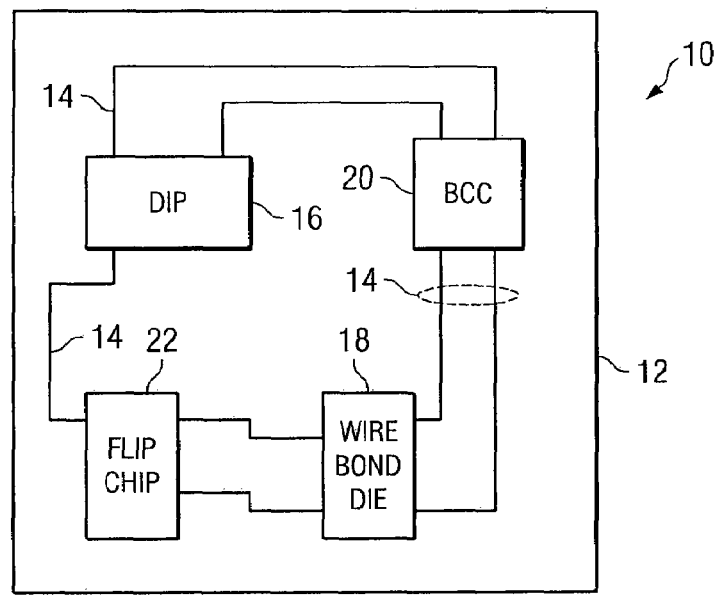
FIG. 1 illustrates a PCB with different types of packages mounted to its surface.

FIG. 1 illustrates electronic device 10 having a chip carrier substrate or printed circuit board (PCB) 12 with a plurality of semiconductor packages or semiconductor die mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, radio frequency (RF) circuits, discrete devices, or other semiconductor die or electrical components.

In FIG. 1, PCB 12 provides a general substrate for structural support and electrical interconnect of the semiconductor packages and other electronic components mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and any connected external system components. Traces 14 also provide power and ground connections to each of the semiconductor packages.

For the purpose of illustration, several types of semiconductor packages, including a dual in-line package (DIP) 16, wire-bonded die 18, bump chip carrier (BCC) 20, and flip chip package 22, are shown mounted on PCB 12. Depending upon the system requirements, any combination of semiconductor packages or other electronic components can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality and represent known good units (KGUs), electronic devices can be manufactured using cheaper components and shorten the manufacturing process. The resulting devices are less likely to fail and less expensive to manufacture resulting in lower costs for consumers.

Figure 2A:
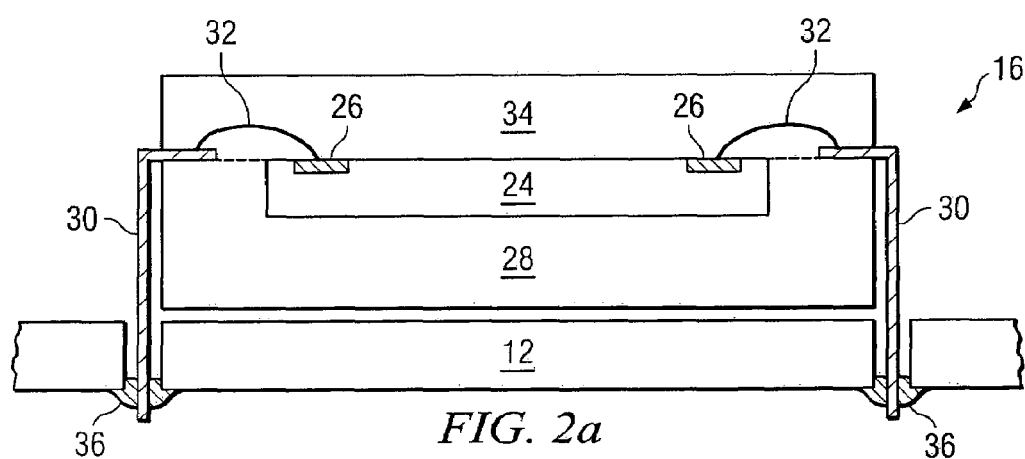
FIGS. 2a-2d illustrate further detail of the semiconductor packages mounted to the PCB.

FIG. 2a illustrates further detail of DIP 16 mounted on PCB 12. DIP 16 includes semiconductor die 24 having contact pads 26. Semiconductor die 24 includes an active area containing analog or digital circuits implemented as active devices, passive devices, conductive layers, and dielectric layers formed within semiconductor die 24 and are electrically interconnected according to the electrical design of the die.

For example, the circuit may include one or more transistors, diodes, inductors, capacitors, resistors, and other circuit elements formed within the active area of die 24. Contact pads 26 are made with a conductive material such as aluminum (Al), copper (Cu), tin (Sn), nickel (Ni), gold (Au), or silver (Ag), and are electrically connected to the circuit elements formed within die 24. Contact pads 26 are formed by a physical vapor deposition (PVD), chemical vapor deposition (CVD), electrolytic plating, or electroless plating process. During assembly of DIP 16, semiconductor die 24 is mounted to a die attach area of lower portion 28 of the package body using a gold-silicon eutectic layer or adhesive material, such as thermal epoxy. The package body includes an insulative packaging material such as plastic or ceramic. Conductor leads 30 are connected to lower portion 28 of the body and bond wires 32 are formed between leads 30 and contact pads 26 of die 24. An encapsulant 34 is deposited over the package for environmental protection by preventing moisture and particles from entering the package and contaminating die 24, contact-pads 26, or bond wires 32. DIP 16 is connected to PCB 12 by inserting leads 30 into holes formed through PCB 12. Solder material 36 is flowed around leads 30 and into the holes to physically and electrically connect DIP 16 to PCB 12. Solder material 36 can be metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high lead, or lead free.

Figure 2B:
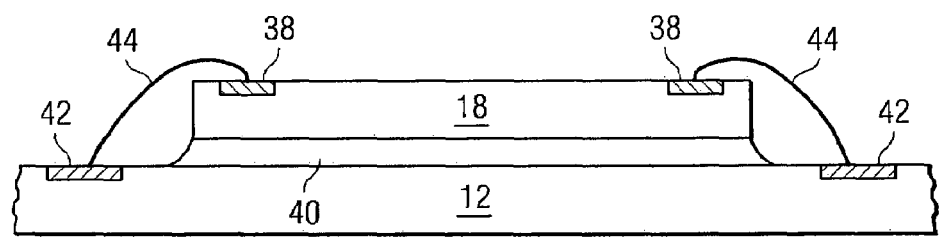

Referring to FIG. 2b, a wire-bonded die 18 having contact pads 38 is mounted to PCB 12 using adhesive material 40. Contact pads 42 are formed on the surface of PCB 12 and electrically connect to one or more traces 14 formed on or within the layers of PCB 12. Bond wires 44 are formed between contact pads 38 of die 18 and contact pads 42 of PCB 12.

Figure 2C:
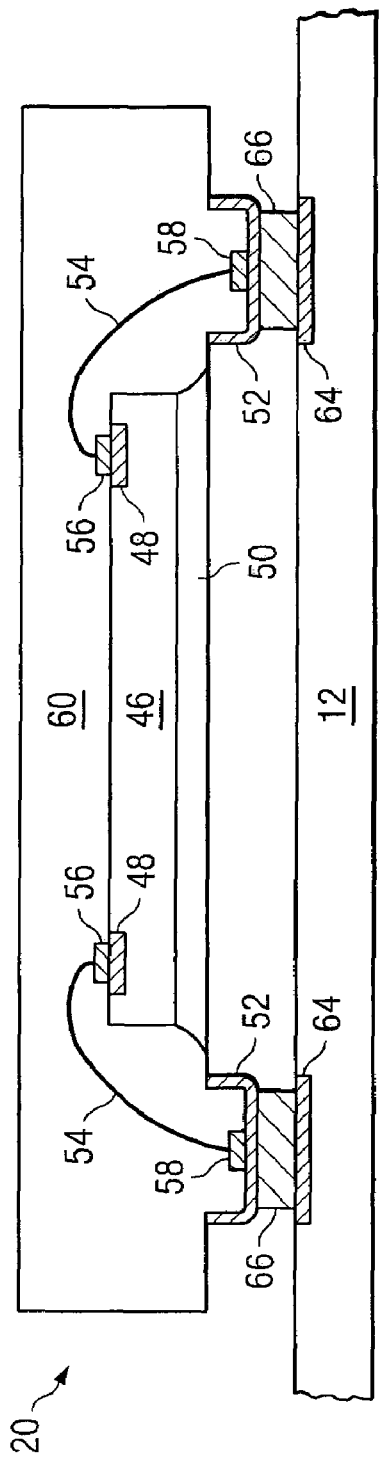

FIG. 2c illustrates further detail of BCC 20 with an incorporated semiconductor die, integrated circuit (IC), or combination thereof. Semiconductor die 46 having contact pads 48 is mounted over a carrier using an underfill or epoxy-resin adhesive material 50. Semiconductor die 46 includes an active area containing analog or digital circuits implemented as active devices, passive devices, conductive layers, and dielectric layers formed within semiconductor die 46 and are electrically interconnected according to the electrical design of the die. For example, the circuit may include one or more transistors, diodes, inductors, capacitors, resistors, and other circuit elements formed within the active area of die 46. Contact pads 48 are connected to the electrical devices and circuitry formed within the active area of die 46. Bond wires 54 and bond pads 56 and 58 electrically connect contact pads 48 of die 46 to contact pads 52 of BCC 20. Mold compound or encapsulant 60 is deposited over die 46, bond wires 54 and contact pads 52 to provide physical support and electrical insulation for the device. Contact pads 64 are formed on PCB 12 and electrically connect to one or more conductive signal traces 14. Solder material is deposited between contact pads 52 of BCC 20 and contact pads 64 of PCB 12. The solder material is reflowed to form bumps 66 which form a mechanical and electrical connection between BCC 20 and PCB 12.

Figure 2D:
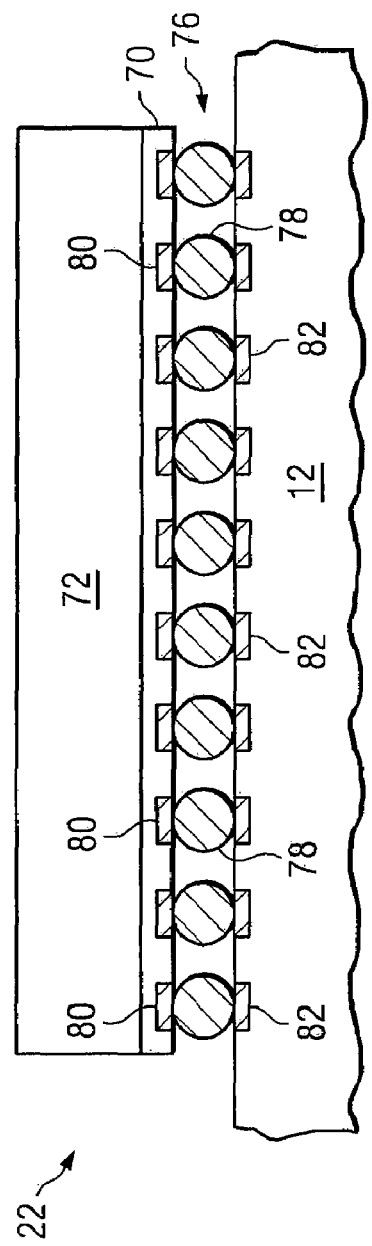

In FIG. 2d, flip chip style semiconductor device 22 has a semiconductor die 72 with active area 70 mounted face down toward PCB 12. Active area 70 containing analog or digital circuits implemented as active devices, passive devices, conductive layers, and dielectric layers formed within semiconductor die 72, is electrically interconnected according to the electrical design of the die. For example, the circuit may include one or more transistors, diodes, inductors, capacitors, resistors, and other circuit elements formed within active area 70 of die 72. The electrical and mechanical interconnect is achieved through solder bump structure 76 comprising a large number of individual conductive solder bumps or balls 78. The solder bumps are formed on bump pads or interconnect sites 80, which are disposed on active area 70. The bump pads 80 connect to the active circuits by conduction tracks in active area 70. The solder bumps 78 are electrically and mechanically connected to contact pads or interconnect sites 82 on PCB 12 by a solder reflow process. The interconnect sites 82 are electrically connected to one or more conductive signal traces 14 on PCB 12. The flip chip semiconductor device provides a short electrical conduction path from the active devices on die 72 to conduction tracks on PCB 12 in order to reduce signal propagation distance, lower capacitance, and achieve overall better circuit performance.

Figure 3A:
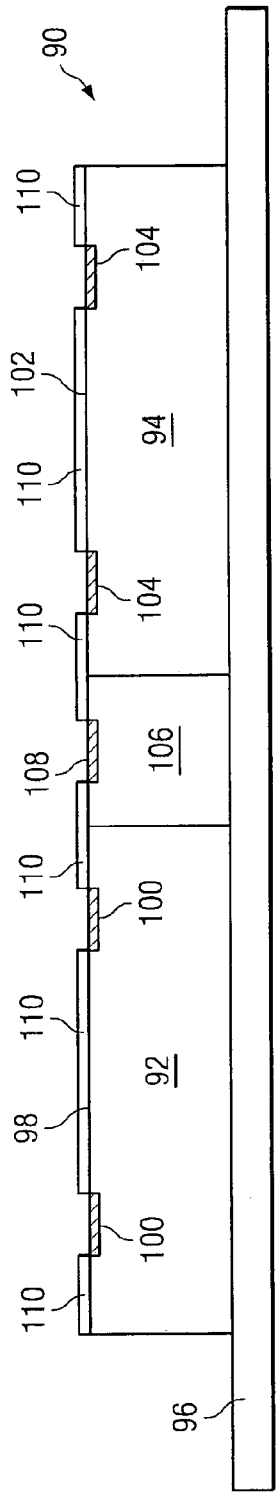

FIGS. 3a-3i illustrate a process of forming conductive vias in a peripheral region around a semiconductor die. To start the process, a plurality of semiconductor die is formed on a semiconductor wafer 90 using conventional integrated circuit processes, as described above. The semiconductor wafer, containing semiconductor die 92 and 94, is mounted to expansion table 96 with ultraviolet (UV) tape, as shown in FIG. 3a. The backside of semiconductor die 92 is affixed to expansion table 96 with its active surface 98 and contact pads 100 oriented face up. Likewise, the backside of semiconductor die 94 is mounted to expansion table 96 with its active surface 102 and contact pads 104 oriented face up. Contact pads 100 and 104 electrically connect to active and passive devices and signal traces in active areas 98 and 102 of semiconductor die 92 and 94, respectively.

Semiconductor wafer 90 has saw street 106 disposed between semiconductor die 92 and 94. A test contact pad 108 is disposed in saw street 106. A passivation layer 110 is deposited over semiconductor wafer 90. Passivation layer 110 can be silicon dioxide (SiO2), silicon nitride (Si3N4), silicon oxynitride (SiON), tantalum pentoxide (Ta2O5), aluminum oxide (Al2O3), polyimide (PI), benzocyclobutene (BCB), polybenzoxazole (PBO), or other suitable material having insulating properties. A portion of passivation layer 110 is removed by an etching process to expose contact pads 100 and 104 and test contact pad 108.

Figure 3B:
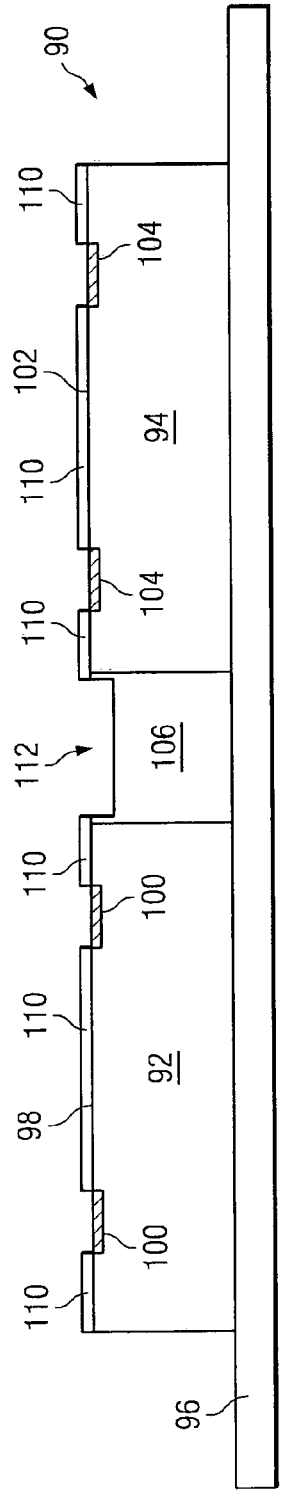

In FIG. 3b, a portion of passivation layer 110 and saw street 106 is removed by a wet or dry etching process to a depth of 5-10 micrometers (μm) to form recess 112. The etching process removes test contact pad 108 in forming recess 112.

Figure 3C:
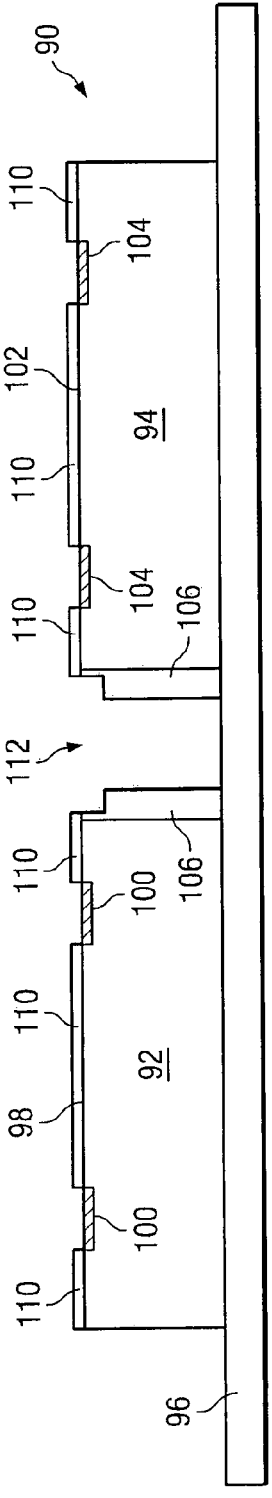

In FIG. 3c, a saw blade or laser tool cuts through saw street 106 down to expansion table 96 in a dicing operation. The saw blade has a width less than the width of saw street 106. A portion of saw street 106 remains adjacent to semiconductor die 92 and 94.

Figure 3D:
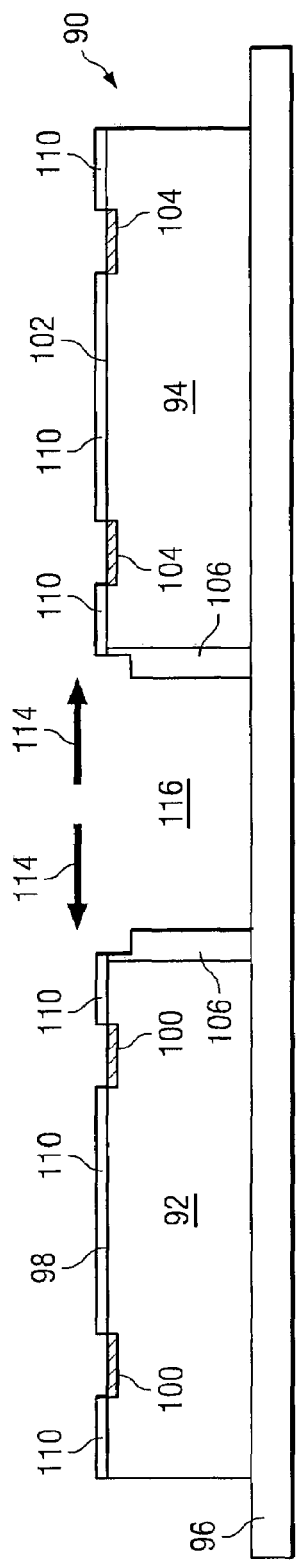

In FIG. 3d, expansion table 96 moves in two-dimension lateral directions, as shown by arrows 114, to expand the width of saw street 106, i.e., form a gap 116 and create a greater physical separation between the die. Expansion table 96 moves substantially the same distance in the x-axis and y-axis within the tolerance of the table control to provide separation around a periphery of each die. The post-expansion width of gap 116 ranges from 5-200 μm. The expanded dimension depends on the design embodiment, i.e., half-via, full-via, single row via, or double/multiple row via. Gap 116 defines a peripheral region around the semiconductor die.

In an alternate embodiment, the semiconductor wafer is diced to separate the semiconductor die. The individual semiconductor die are then transferred and affixed to a temporary chip carrier in a pick-and-place operation using an adhesive layer, e.g., thermal epoxy. The semiconductor die are placed on the chip carrier so as to have a predetermined separation gap. In general, the separation gap has sufficient width to form conductive vias within the gap, as described below.

Figure 3E:
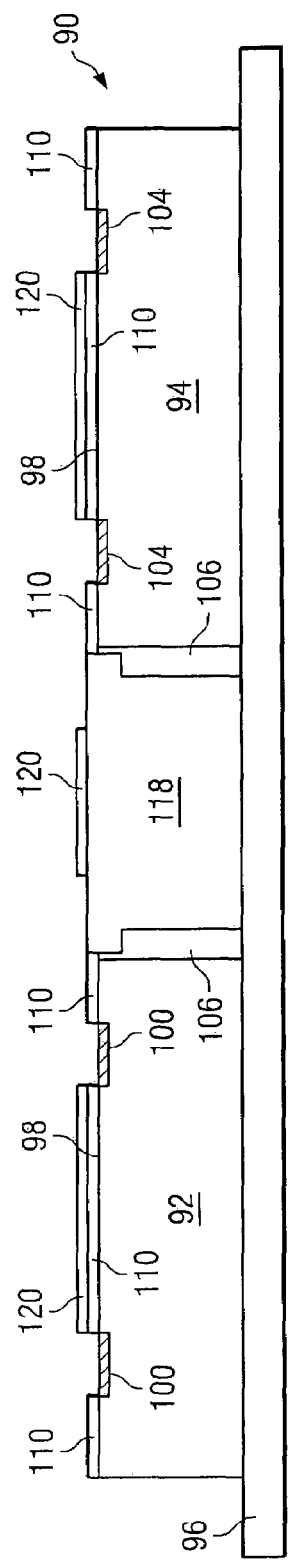

In FIG. 3e, an organic insulating material 118 is deposited in gap 116 and recess 112 using spin coating, needle dispensing, or other suitable application process. Organic material 118 can be BCB, PI, or acrylic resin. Alternatively, other non-conductive materials such as a polymer molding compound, liquid epoxy molding, compression molding, soft laminating film, or other material having dielectric or electrical insulating properties can be deposited in gap 116. The non-conductive materials can also be deposited using a transfer molding or injection molding process. A masking layer 120 is formed over passivation layer 110 between contact pads 100 and 104 and over a central region of organic material 118.

Figure 3F:
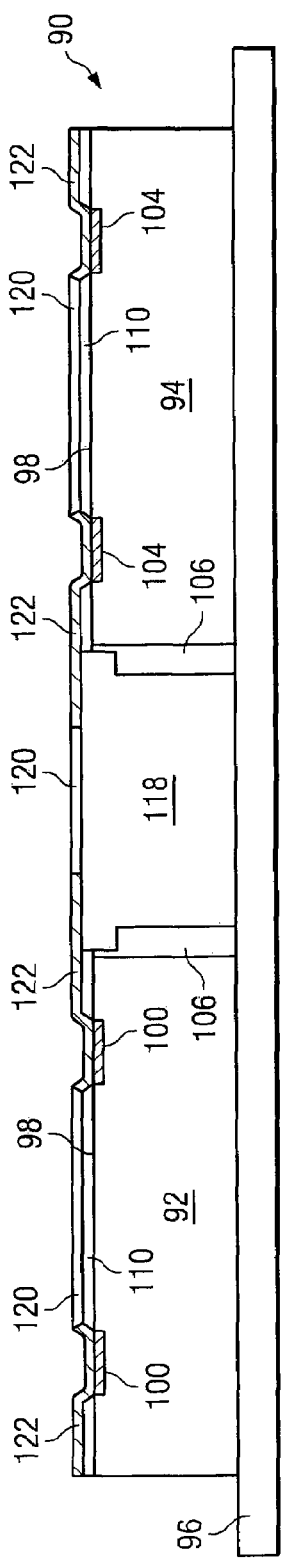

In FIG. 3f, an electrically conductive material 122 is patterned and deposited over the unmasked areas of semiconductor die 92 and 94 and organic material 118 using PVD, CVD, evaporation, electrolytic plating, electroless plating, screen printing, or other suitable metal deposition process. The conductive material 122 can be metals such as Al, Cu, Sn, Ni, Au, Ag, or other suitable electrically conductive material. The conductive layer 122 electrically connects to contact pads 100 and 104 to form signal traces or redistribution layers (RDL).

In FIG. 3g, a portion of organic material 118 is removed by laser drilling or deep reactive ion etching (DRIE) to create an opening 124 that extends down to expansion table 96. Opening 124 can be vertical or tapered. An electrically conductive material 126 is deposited into opening 124 using PVD, CVD, evaporation, electrolytic plating, electroless plating, screen printing, or other suitable metal deposition process, as shown in FIG. 3h. The conductive material 126 can be metals such as Al, Cu, Sn, Ni, Au, Ag, or other suitable electrically conductive material. The remaining masking layer 120 is removed.

A similar structure as described in FIGS. 3a-3g is formed on each side of semiconductor die 92 and 94. Accordingly, conductive layer 126 electrically connects to RDLs 122.

In FIG. 3i, semiconductor die 92 and 94 are singulated through a center portion of gap 116, i.e., to bisect conductive material 126 and create conductive through hole vias (THV) 128. The gap region 116 is cut by a cutting tool 132 such as a saw blade or laser. By cutting through the center of conductive material 126, THVs 128 are conductive half-vias. The cutting tool completely severs the gap region to separate the die. The semiconductor die are removed from expansion table 96.

Figure 4A:
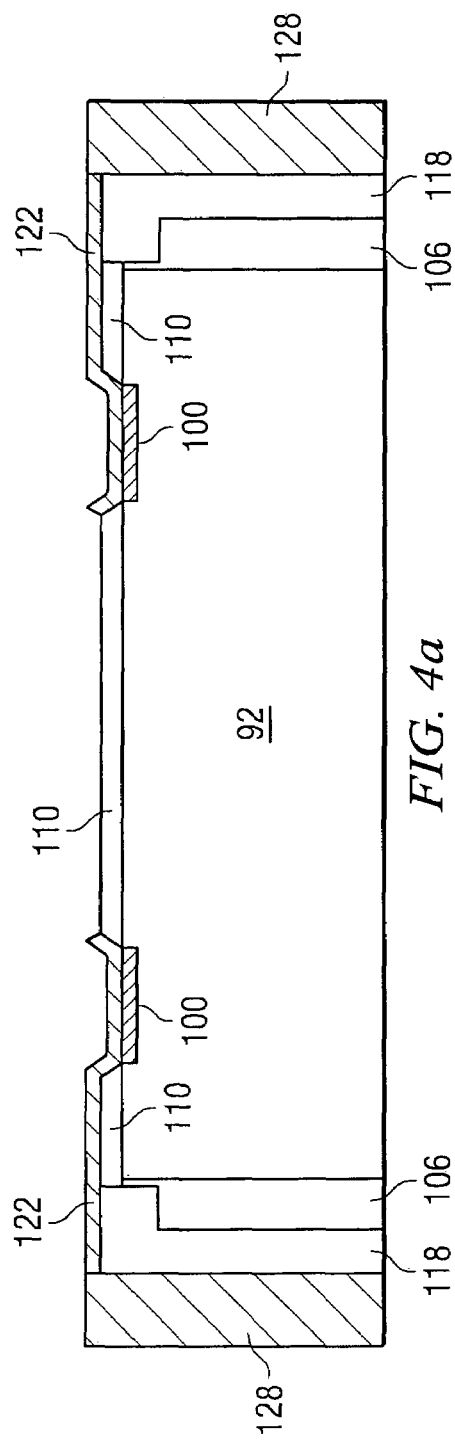
FIGS. 4a-4b illustrate cross-sectional and top views of the semiconductor die with RDLs and conductive half-vias formed in the peripheral region around the die.
Figure 4B:
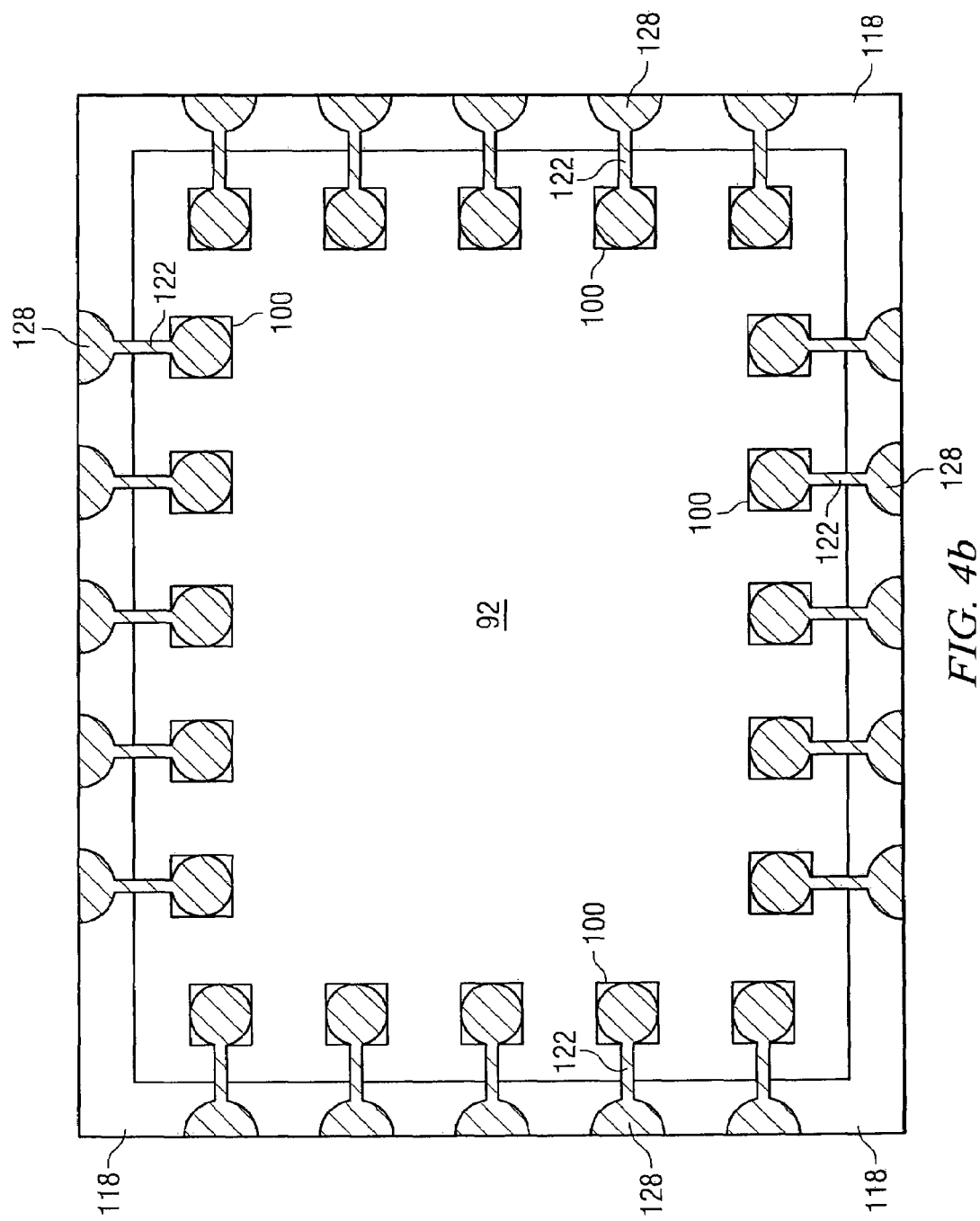

FIG. 4a shows a final configuration for semiconductor die 92. Conductive THVs 128 electrically connect through RDLs 122 to contact pads 100. FIG. 4b shows a top view of semiconductor die 92 with conductive THVs 128 electrically connecting through RDLs 122 to contact pads 100.

Figure 5A:
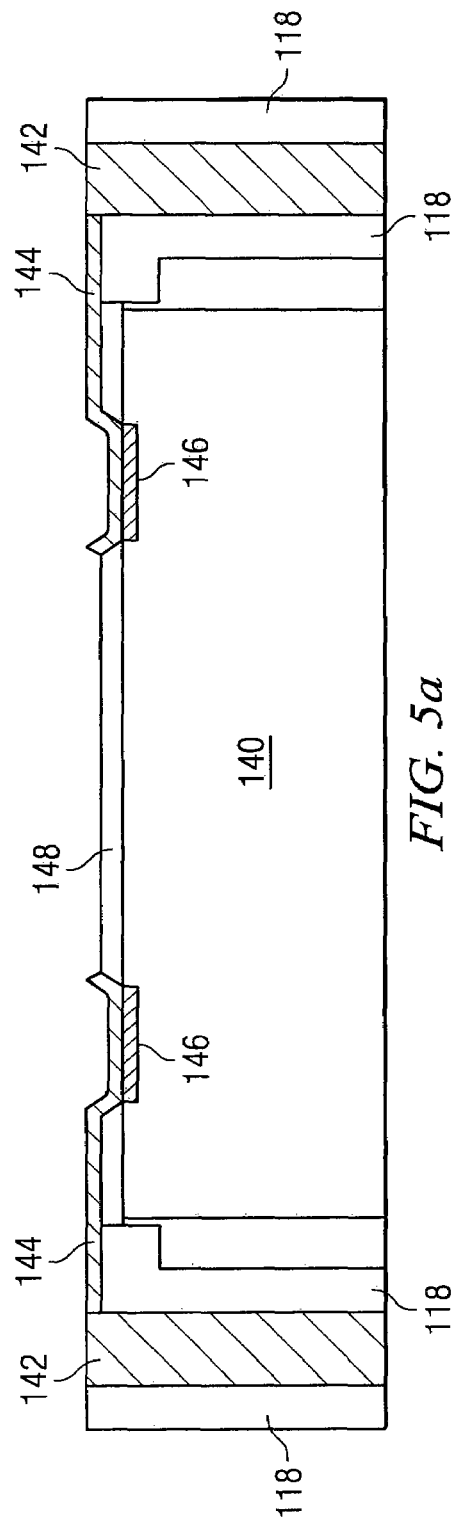
FIGS. 5a-5b illustrate cross-sectional and top views of the semiconductor die with RDLs and conductive full-vias formed in the peripheral region around the die.
Figure 5B:
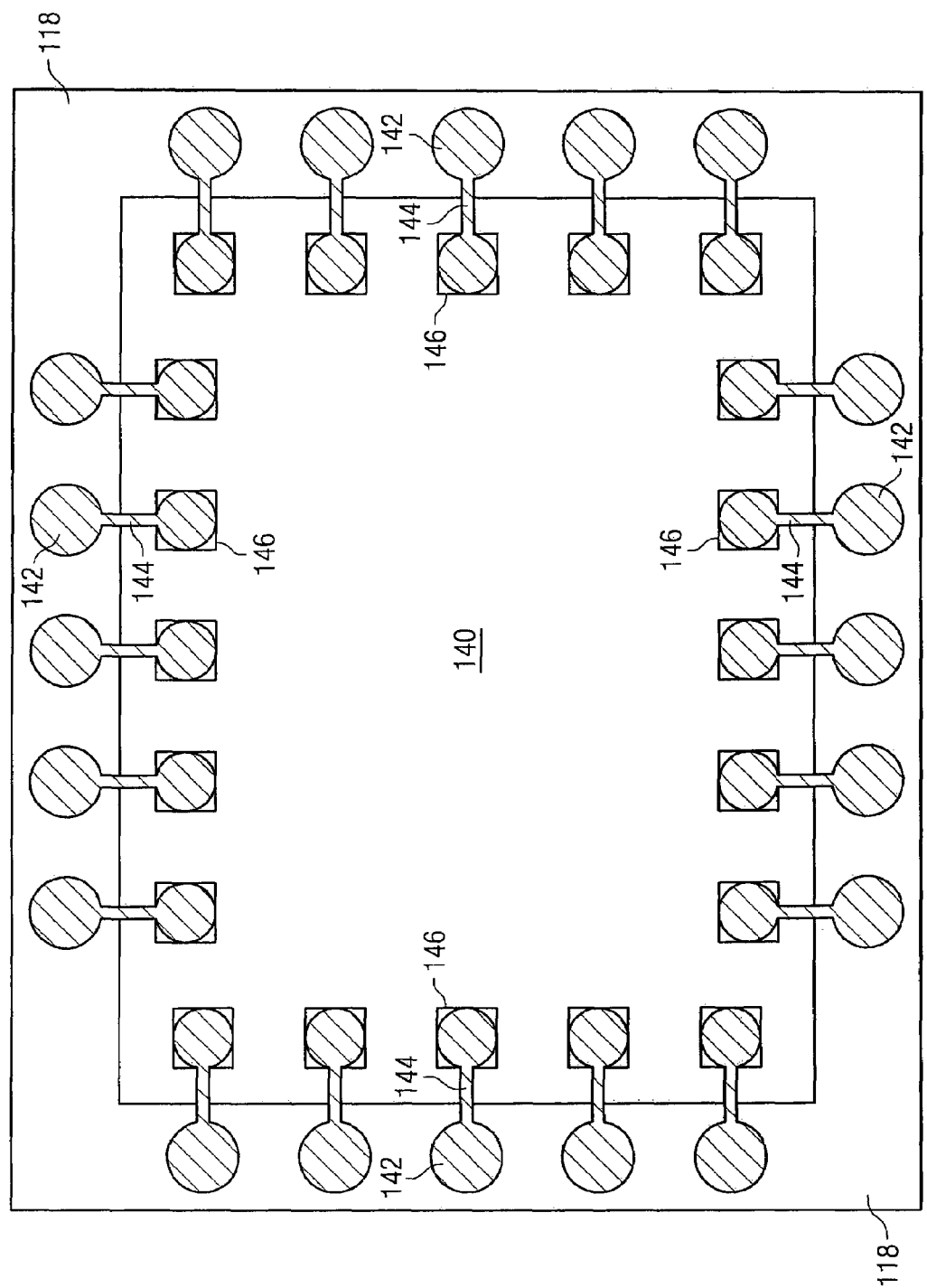

FIG. 5a shows semiconductor die 140 with conductive full-vias 142 providing an electrical connection from one side of each die to the other side of the die. To form full-vias 142, the gap is made sufficiently wide to form two side-by-side conductive regions like 126 in FIG. 3h. The gap is filled with organic material like 118. The two conductive regions are separated by the organic material in the gap. As a result, two side-by-side conductive vias are formed in the gap, each surrounded by the organic material. The cutting tool severs the organic material between the two conductive vias to provide full-vias 142. RDLs 144 are formed similar to RDLs 122 in FIG. 3f. Conductive THVs 142 electrically connect through RDLs 144 to contact pads 146 of semiconductor die 140. A passivation layer 148 is disposed over semiconductor die 140. FIG. 5b shows a top view of semiconductor die 140 with conductive THVs 142 electrically connecting through RDLs 144 to contact pads 146.

FIGS. 6a-6i illustrate an alternate process of forming conductive vias in a peripheral region around a semiconductor die. A plurality of semiconductor die is formed on a semiconductor wafer 150 using conventional integrated circuit processes. The semiconductor wafer, containing semiconductor die 152 and 154, is mounted to expansion table 156 with UV tape, as shown in FIG. 6a. The backside of semiconductor die 152 is affixed to expansion table 156 with its active surface 158 and contact pads 160 oriented face up. Likewise, the backside of semiconductor die 154 is mounted to expansion table 156 with its active surface 162 and contact pads 164 oriented face up. Contact pads 160 and 164 electrically connect to active and passive devices and signal traces in active areas 158 and 162 of semiconductor die 152 and 154, respectively.

Semiconductor wafer 150 has saw street 166 disposed between semiconductor die 152 and 154. A test contact pad 168 is disposed in saw street 166. A passivation layer 170 is deposited over semiconductor wafer 150. Passivation layer 170 can be $SiO_2$, $Si_3N_4$, SiON, $Ta_2O_5$, $Al_2O_3$, PI, BCB, PBO, or other suitable material having insulating properties. A portion of passivation layer 170 is removed by an etching process to expose contact pads 160 and 164 and test contact pad 168.

In FIG. 6b, a portion of passivation layer 170 and saw street 166 is removed by a wet or dry etching process to a depth of 5-10 µm to form recess 172. The etching process removes test contact pad 168 in forming recess 172.

In FIG. 6c, an electrically conductive material 174 is patterned and deposited over passivation layer 170, contact pads 160 and 164, and into recess 172 using PVD, CVD, evaporation, electrolytic plating, electroless plating, screen printing, or other suitable metal deposition process. The conductive material 174 can be metals such as Al, Cu, Sn, Ni, Au, Ag, or other suitable electrically conductive material. The conductive layer 174 electrically connects to contact pads 160 and 164 to form signal traces or RDL. The conformal application of conductive material 174 follows the contour of semiconductor die 152 and 154 and recess 172. As a result, RDLs 174 step down from passivation layer 170 into recess 172.

In FIG. 6d, a saw blade or laser tool cuts through conductive layer 174 in recess 172 and saw street 166 down to expansion table 156 in a dicing operation. The saw blade has a width less than the width of saw street 166. A portion of saw street 166 remains adjacent to semiconductor die 152 and 154.

In FIG. 6e, expansion table 156 moves in two-dimension lateral directions, as shown by arrows 175, to expand the width of saw street 166, i.e., form a gap 176 and create a greater physical separation between the die. Expansion table 156 moves substantially the same distance in the x-axis and y-axis within the tolerance of the table control to provide separation around a periphery of each die. The post-expansion width of gap 176 ranges from 5-200 µm. The expanded dimension depends on the design embodiment, i.e., half-via, full-via, single row via, or double/multiple row via. Gap 176 defines a peripheral region around the semiconductor die.

In an alternate embodiment, the semiconductor wafer is diced to separate the semiconductor die. The individual semiconductor die are then transferred and affixed to a temporary chip carrier in a pick-and-place operation using an adhesive layer, e.g., thermal epoxy. The semiconductor die are placed on the chip carrier so as to have a predetermined separation gap. In general, the separation gap has sufficient width to form conductive vias within the gap.

In FIG. 6f, an organic insulating material 178 is deposited in gap 176 using spin coating, needle dispensing, or other suitable application process. Organic material 178 can be BCB, PI, or acrylic resin. Alternatively, other non-conductive materials such as a polymer molding compound, liquid epoxy molding, compression molding, soft laminating film, or other material having dielectric or electrical insulating properties can be deposited in gap 176. The non-conductive materials can also be deposited using a transfer molding or injection molding process. A masking layer 180 is formed over organic material 178.

In FIG. 6g, a portion of organic material 178 and masking layer 180 is removed by laser drilling or DRIE to create an opening 184 that extends down to expansion table 156. Opening 184 can be vertical or tapered. An electrically conductive material 186 is deposited into opening 184, as shown in FIG. 6h. Note that conductive material 186 is recessed with respect to active surfaces 158 and 162 of semiconductor die 152 and 154. An electrically conductive layer 188 is deposited over organic material 178 and conductive material 186. Conductive layer 188 electrically connects RDLs 174 to conductive material 186. The deposition of conductive materials 186 and 188 can involve PVD, CVD, evaporation, electrolytic plating, electroless plating, screen printing, or other suitable metal deposition process. The conductive materials 186 and 188 can be metals such as Al, Cu, Sn, Ni, Au, Ag, or other suitable electrically conductive material. The remaining masking layer 180 is removed. A similar structure as described in FIGS. 6a-6h is formed on each side of semiconductor die 152 and 154.

In FIG. 6i, semiconductor die 152 and 154 are singulated through a center portion of gap 176, i.e., to bisect conductive material 186 and create conductive THV 190. The post-expansion gap region 176 is cut by a cutting tool 192 such as a saw blade or laser. By cutting through the center of conductive material 186, THVs 190 are conductive half-vias. The cutting tool completely severs the gap region to separate the die. The semiconductor die are removed from expansion table 156.

Figure 7B:
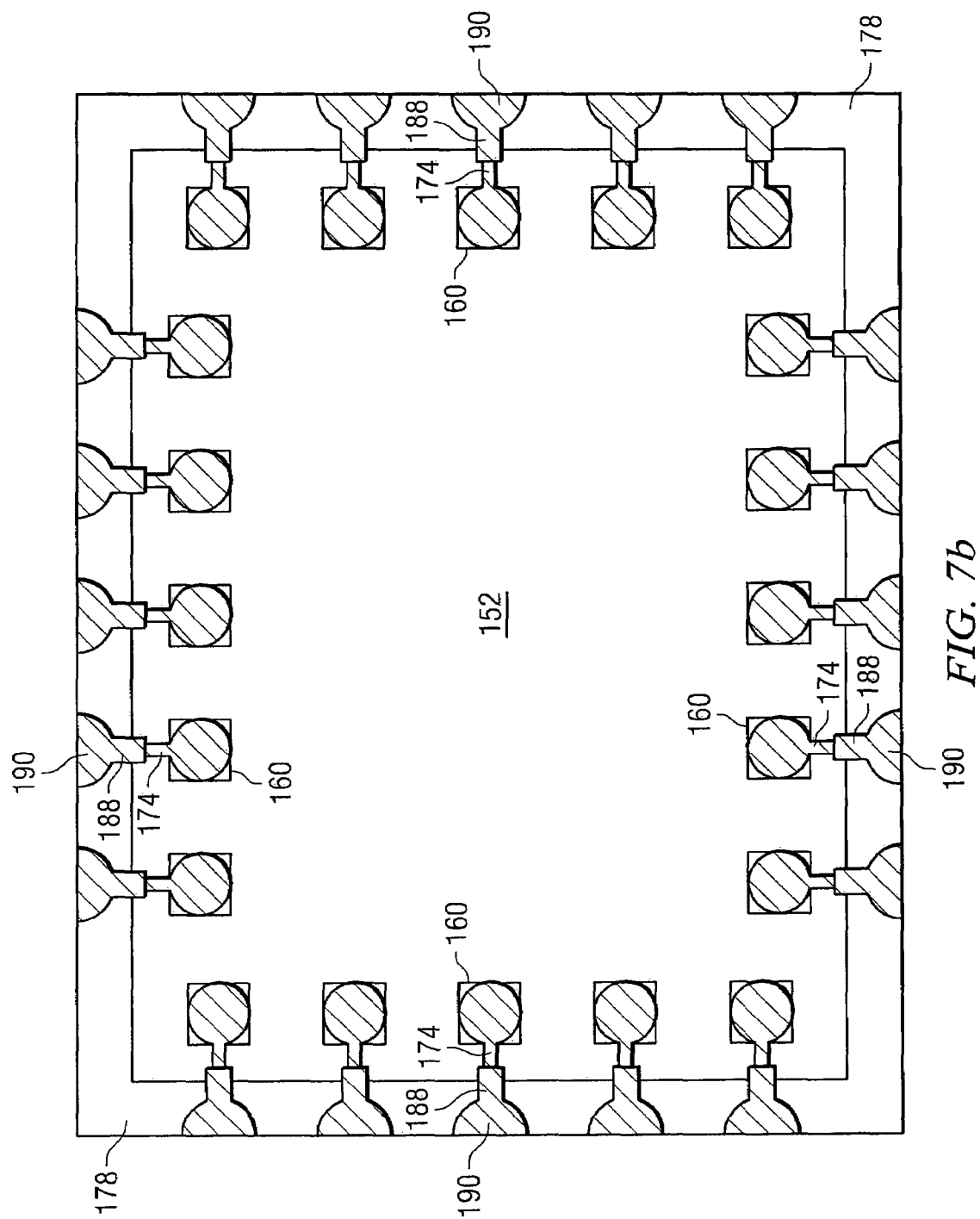

FIG. 7a shows a final configuration for semiconductor die 152. Conductive THVs 190 electrically connect through conductive layer 188 and RDLs 174 to contact pads 160. The conformal deposition of conductive material 174 into recess 172 causes the RDL to be stepped down from passivation layer 170. In addition, conductive THVs 190 are recessed with respect to the top surface of semiconductor die 152. FIG. 7b shows a top view of semiconductor die 152 with recessed conductive THVs 190 electrically connecting through conductive layer 188 and stepped RDLs 174 to contact pads 160.

Figure 8B:
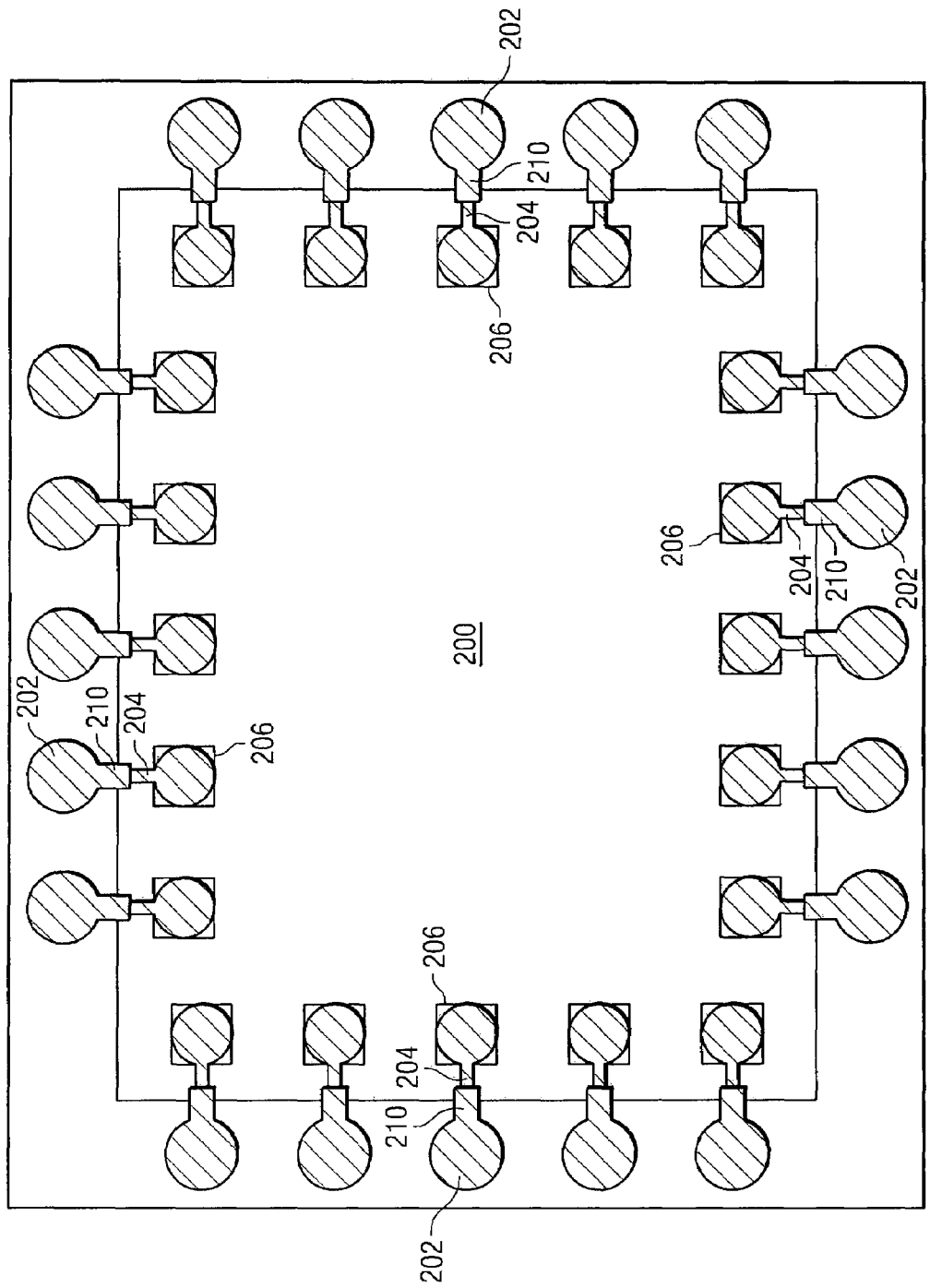

FIG. 8a shows semiconductor die 200 with conductive full-vias 202 provide an electrical connection from one side of each die to the other side of the die. To form full-vias 202, the gap is made sufficiently wide to form two side-by-side conductive regions like 186 in FIG. 6h. The gap is filled with organic material like 178. The two conductive regions are separated by the organic material in the gap. As a result, two side-by-side conductive vias are formed in the gap, each surrounded by the organic material. The cutting tool severs the organic material between the two conductive vias to provide full-vias 202. RDLs 204 are formed similar to RDLs 174 in FIG. 6c. Conductive THVs 202 electrically connect through conductive layer 210 and RDLs 204 to contact pads 206 of semiconductor die 200. A passivation layer 208 is disposed over semiconductor die 200. The conformal deposition of conductive material into recess 212 causes RDL 204 to be stepped down from passivation layer 208. In addition, conductive THVs 202 are recessed with respect to the top surface of semiconductor die 200. FIG. 8b shows a top view of semiconductor die 200 with recessed conductive THVs 202 electrically connecting through conductive layer 210 and stepped RDLs 204 to contact pads 206.

The formation of recessed conductive vias and stepped RDLs, as well as removal of test pads located on the saw streets, as described above helps avoid die chipping. In addition, by forming the stepped RDLs prior to wafer singulation, the RDLs can more readily adapt to any post-expansion misalignment of the die.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
   providing a semiconductor wafer having a plurality of semiconductor die each with a peripheral region around the semiconductor die;
   forming an insulating layer over the semiconductor wafer;
   removing a portion of the insulating layer and peripheral region to form a recess around the semiconductor die;
   depositing a first conductive layer over the insulating layer and recess, the first conductive layer being electrically connected to contact pads on the semiconductor die and conforming to a step into the recess;
   creating a gap through the first conductive layer and peripheral region around the semiconductor die;
   depositing an insulating material in the gap;
   removing a portion of the insulating material to form a through hole via (THV);
   depositing a conductive material in the THV to form a conductive THV, the conductive THV being recessed with respect to a surface of the semiconductor die, the conductive THV being electrically connected to the first conductive layer; and
   singulating the semiconductor wafer through the gap to separate the semiconductor die.

2. The method of claim 1, wherein singulating the semiconductor wafer occurs through the conductive THV in the gap to form a conductive half-via.

3. The method of claim 1, wherein singulating the semiconductor wafer occurs through the insulating material in the gap to form a conductive full-via.

4. The method of claim 1, further including forming a masking layer over the insulating material prior to depositing the conductive material.

5. The method of claim 1, further including removing a portion of the insulating layer to expose the contact pads.

6. The method of claim 1, wherein creating the gap includes:
   cutting through the semiconductor wafer less than a width of the peripheral region around the semiconductor die; and
   moving the semiconductor die apart to expand the gap.

7. The method of claim 1, further including forming a second conductive layer over the insulating material and conductive material to electrically connect the conductive material to the first conductive layer.

8. A method of making a semiconductor device, comprising:
provided a semiconductor wafer having a plurality of semiconductor die each with a peripheral region around the semiconductor die;
forming an insulating layer over the semiconductor wafer;
removing a portion of the insulating layer and peripheral region to form a recess around the semiconductor die;
creating a gap through the peripheral region around the semiconductor die;
depositing an insulating material in the gap;
depositing a conductive layer over the insulating layer and insulating material, the conductive layer being electrically connected to contact pads on the semiconductor die;
removing a portion of the insulating material to form a through hole via (THV);
depositing a conductive material in the THV to form a conductive THV, the conductive THV being electrically connected to the conductive layer; and
singulating the semiconductor wafer through the gap to separate the semiconductor die.

9. The method of claim 8, wherein singulating the semiconductor wafer occurs through the conductive THV in the gap to form a conductive half-via.

10. The method of claim 8, wherein singulating the semiconductor wafer occurs through the insulating material in the gap to form a conductive full-via.

11. The method of claim 8, further including forming a masking layer over the insulating material prior to depositing the conductive material.

12. The method of claim 8, further including removing a portion of the insulating layer to expose the contact pads.

13. The method of claim 8, wherein creating the gap includes:
cutting through the semiconductor wafer less than a width of the peripheral region around the semiconductor die; and
moving the semiconductor die apart to expand the gap.

14. A method of making a semiconductor device, comprising:
providing a semiconductor die having a peripheral region around the semiconductor die;
forming an insulating layer over the semiconductor die;
removing a portion of the insulating layer and peripheral region to form a recess around the semiconductor die;
depositing a first conductive layer over the insulating layer and recess, the first conductive layer being electrically connected to contact pads on the semiconductor die and conforming to a step into the recess;
creating a gap through the first conductive layer and peripheral region around the semiconductor die;
depositing an insulating material in the gap;
removing a portion of the insulating material to form a through hole via (THV); and
depositing a conductive material in the THV to form a conductive THV, the conductive THV being recessed with respect to a surface of the semiconductor die, the conductive THV being electrically connected to the first conductive layer.

15. The method of claim 14, wherein singulating the semiconductor wafer occurs through the conductive THV to form a conductive half-via.

16. The method of claim 14, wherein singulating the semiconductor wafer occurs through the insulating material in the gap to form a conductive full-via.

17. The method of claim 14, further including forming a masking layer over the insulating material prior to depositing the conductive material.

18. The method of claim 14, further including removing a portion of the insulating layer to expose the contact pads.

19. The method of claim 14, wherein creating the gap includes:
cutting through the semiconductor wafer less than a width of the peripheral region around the semiconductor die; and
moving the semiconductor die apart to expand the gap.

20. The method of claim 14, further including forming a second conductive layer over the insulating material and conductive material to electrically connect the conductive material to the first conductive layer.

* * * * *